(12) United States Patent
Flesch et al.

(10) Patent No.: US 9,667,249 B2
(45) Date of Patent: May 30, 2017

(54) DOMESTIC APPLIANCE DEVICE

(75) Inventors: Sebastien Flesch, Gerstheim (FR); Markus Hechtbauer, Lappersdorf-Hainsacker (DE); Yves Lebrun, Eschau (FR); Gerhard Mager, Cadolzburg (DE); Markus Redelstab, Eggstätt (DE)

(73) Assignee: BSH Hausgeräte GmbH, Munich (DE)

( * ) Notice: Subject to any disclaimer, the term of this patent is extended or adjusted under 35 U.S.C. 154(b) by 114 days.

(21) Appl. No.: 13/643,127

(22) PCT Filed: Apr. 15, 2011

(86) PCT No.: PCT/EP2011/055979
§ 371 (c)(1),
(2), (4) Date: Oct. 24, 2012

(87) PCT Pub. No.: WO2011/138149
PCT Pub. Date: Nov. 10, 2011

(65) Prior Publication Data
US 2013/0038526 A1  Feb. 14, 2013

(30) Foreign Application Priority Data

May 6, 2010  (EP) ................................... 10290247

(51) Int. Cl.
*G09G 5/00* (2006.01)
*H03K 17/96* (2006.01)
*G06F 3/0488* (2013.01)

(52) U.S. Cl.
CPC ..... *H03K 17/9622* (2013.01); *G06F 3/04886* (2013.01); *H03K 17/962* (2013.01); *H03K 2217/96031* (2013.01)

(58) Field of Classification Search
USPC ......................................... 345/156, 173, 174
See application file for complete search history.

(56) References Cited

U.S. PATENT DOCUMENTS

| | | | | |
|---|---|---|---|---|
| 3,886,539 | A * | 5/1975 | Gould, Jr. ............... | F24C 7/087 219/445.1 |
| 5,239,152 | A * | 8/1993 | Caldwell .............. | H01H 13/702 200/600 |
| 5,428,341 | A * | 6/1995 | Takahashi ..................... | 340/505 |
| 5,742,476 | A * | 4/1998 | Miyazaki et al. ....... | 361/679.21 |
| 6,504,269 | B1 | 1/2003 | Miyajima et al. | |

(Continued)

FOREIGN PATENT DOCUMENTS

| | | |
|---|---|---|
| DE | 202007005325 U1 | 8/2007 |
| DE | 102007023175 A1 | 11/2008 |
| EP | 2065794 A1 | 6/2009 |

OTHER PUBLICATIONS

International Search Report PCT/EP2011/055979.

*Primary Examiner* — Jonathan Boyd
*Assistant Examiner* — Sosina Abebe
(74) *Attorney, Agent, or Firm* — Michael E. Tschupp; Andre Pallapies

(57) ABSTRACT

A household appliance apparatus includes a display screen and an input unit which has at least one substantially transparent input device. In order to achieve advantageous ease of use with little design expenditure, the input device covers only a partial region of the display screen. The input device may hereby be configured as a conductive layer.

27 Claims, 3 Drawing Sheets

(56) References Cited

U.S. PATENT DOCUMENTS

| | | | | |
|---|---|---|---|---|
| 6,587,130 | B1 * | 7/2003 | Amari | B60K 35/00 |
| | | | | 715/810 |
| 6,654,002 | B1 * | 11/2003 | Yamaki | 345/157 |
| 6,769,320 | B1 * | 8/2004 | Bollgohn | B60K 35/00 |
| | | | | 73/866.3 |
| 8,523,304 | B2 | 9/2013 | Kim | |
| 2002/0118175 | A1 * | 8/2002 | Liebenow et al. | 345/168 |
| 2003/0150853 | A1 * | 8/2003 | Kang | 219/720 |
| 2004/0080486 | A1 | 4/2004 | Troxell et al. | |
| 2007/0029172 | A1 * | 2/2007 | Choi | G06F 1/1626 |
| | | | | 200/1 B |
| 2007/0200875 | A1 * | 8/2007 | Seeger | H03J 1/048 |
| | | | | 345/902 |
| 2008/0105134 | A1 * | 5/2008 | Elston, III et al. | 99/325 |
| 2009/0056386 | A1 * | 3/2009 | Jang et al. | 68/12.27 |
| 2009/0061070 | A1 * | 3/2009 | Greiner et al. | 426/665 |
| 2009/0146970 | A1 | 6/2009 | Lowles et al. | |
| 2009/0153438 | A1 * | 6/2009 | Miller et al. | 345/55 |
| 2009/0160782 | A1 * | 6/2009 | Yang et al. | 345/173 |
| 2009/0324316 | A1 * | 12/2009 | Shvartser | 400/489 |
| 2010/0123632 | A1 * | 5/2010 | Hill et al. | 343/702 |
| 2011/0167181 | A1 * | 7/2011 | Minoo et al. | 710/73 |

\* cited by examiner

DOMESTIC APPLIANCE DEVICE

BACKGROUND OF THE INVENTION

The invention is based on a household appliance apparatus.

A household appliance apparatus having a touch-sensitive display screen is known from the publication DE 10 2007 023 175 A1.

A household appliance apparatus having a display screen and having non-transparent input means is also known from the publication U.S. Pat. No. 5,239,152.

BRIEF SUMMARY OF THE INVENTION

The object of the invention is in particular to supply a generic apparatus with improved attributes in respect of structural outlay and ease of operation.

The invention is based on a household appliance apparatus having a display screen and having an input unit, which has at least one substantially transparent input means.

It is proposed that the input means only covers a partial region of the display screen, so that it is possible to use particularly low-cost input means that are simple to evaluate. A "display screen" refers in particular to an image representation surface of a display that appears expedient to the person skilled in the art. The display could be configured for example as a cathode ray tube display, an FED display, a plasma display, a display with organic light-emitting diodes, a field emission display and/or advantageously as a liquid crystal display. The display preferably has a light source and an image representation means. The light source and image representation means can be configured at least partially as a single piece. The image representation means preferably acts on at least part of the light from the light source, before the part of the light enters the input means. "Provided" means in particular specifically fitted, designed and/or programmed. An "input unit" refers in particular to a unit which supplies at least one characteristic input variable, which features at least one item of information about an interaction of the input means with an operator. The phrase "substantially transparent" means that at least 30%, advantageously at least 60%, particularly advantageously at least 80% of at least one wavelength of visible light emitted by the display screen and penetrating into the input means passes through the input means. An "input means" refers in particular to a means provided to receive an input from an operator and convert it to a detectable characteristic input variable. In particular the phrase "only covers a partial region" means that the input means does not cover the display screen completely. The display screen preferably radiates part of the light from the light source past the input means and advantageously past the input unit. In particular at most 50%, advantageously at most 25%, particularly advantageously at most 10% of the light from the light source emitted by the display screen passes through the input means. "Cover" means in particular that the input unit is disposed in front of the display screen when viewed in the direction of a normal of the display screen.

In a further embodiment it is proposed that the input unit has at least two input means, which cover different partial regions of the display screen. The input unit preferably has at least four input means. "Cover different partial regions" means in particular that at most 10%, advantageously at most 5% of the light from the light source passing through all the input means passes through more than one input means. The two input means allow particularly user-friendly and simple operation in a structurally simple manner.

It is further proposed that the input means are disposed at a distance from one another, thereby allowing particularly simple evaluation of the input means. In particular the phrase "at a distance from one another" means that every point of the one input means is disposed at least 1 mm, preferably at least 2 mm, particularly advantageously at least 5 mm from every point of another input means, preferably parallel to the display screen.

It is further proposed that during operation the input means each supply one characteristic input variable substantially independently of one another, thereby minimizing any structural outlay for evaluating the characteristic input variable. "Substantially independently of one another" means in particular that the characteristic input variables of one of the input means can be assigned uniquely to an operator interaction with the input means. A characteristic input variable of an input means is preferably influenced during an interaction by an operator with another input means less than 50%, advantageously less than 20%, particularly advantageously less than 10% of a value of the characteristic input variables of the interacting input means. A "characteristic input variable" refers in particular to an electrically measurable attribute of the input means, which can be changed by an operator. The characteristic input variable is preferably configured as a resistance, advantageously a capacitance and/or as another attribute that appears expedient to the person skilled in the art.

It is further proposed that the household appliance apparatus has an electronic operating unit, which is provided to combine the input means and the partial region of the display screen to form an adjustable key, thereby supplying an input means that is particularly easy and convenient to operate. An "electronic operating unit" refers in particular to an electronic unit that evaluates the characteristic input variable. The electronic operating unit preferably activates the display. In particular "combine . . . to form an adjustable key" means that the electronic operating unit is provided to change the light incident through the input means, in other words in particular to change a background image of the input means formed by the light.

It is further proposed that the household appliance apparatus has an electronic display unit, which is configured separately from the electronic operating unit, thereby allowing a particularly favorable display and a structurally simple electronic operating unit to be achieved. An "electronic display unit" refers in particular to an electronic unit, which converts compressed and/or serially transmitted image data to signals, which are assigned to individual image points of the display. "Configured separately" means in particular that the electronic display unit and the electronic operating unit are disposed on different printed circuit boards. Alternatively or additionally it means that a data transmission of image data between the electronic display unit and the electronic operating unit takes place in a compressed and/or serial manner.

In one advantageous embodiment of the invention it is proposed that the input means is configured as a conductive layer, meaning that there is no need for movable elements and allowing a reliable and low-cost input means to be achieved. A "conductive layer" means in particular a layer with a surface resistance less than 600Ω, advantageously less than 200Ω and particularly advantageously less than 50Ω. The layer advantageously has a thickness greater than 10 nm. The conductive layer preferably consists at least partially of indium tin oxide, fluorine tin oxide, aluminumdoped zinc oxide, antimony tin oxide and/or another material that appears expedient to the person skilled in the art.

In one advantageous embodiment of the invention it is proposed that the input unit has at least one layer element, which is connected with a material fit to the input means, thereby allowing an image to be represented particularly advantageously on the display. A "layer element" refers in particular to an element, the main extension surface of which is aligned parallel to the display screen. The input unit preferably has two layer elements. The input means is advantageously connected with a material fit, in particular directly, to both layer elements. The layer element is preferably configured as a glass or in particular as a film. The input means is particularly advantageously disposed between two layer elements. "Connected with a material fit" in particular means adhered, welded, vapor deposited and/or advantageously applied by sputtering.

It is further proposed that the input unit covers at most 50% of the display screen, thereby allowing a low-cost structure and low-cost production to be achieved. The input unit advantageously covers at most 25% of the display screen.

It is further proposed that the input unit has at least one substantially transparent conductor path. Alternatively the conductor path could be configured as particularly narrow. The conductor path and input means are preferably made of an identical material. Alternatively the conductor path could be made of another material that appears expedient to the person skilled in the art, for example silver. The transparent conductor path means that contact can be made easily with the input means.

It is further proposed that the input element has at least one flexible printed circuit board, thereby saving space and allowing contact to be made with the conductor path in a structurally simple manner. A "flexible printed circuit board" refers in particular to a printed circuit board, in which flexible conductor paths are applied to a flexible support layer. The printed circuit board can advantageously be bent through at least 15 degrees along at least one extension. An evaluation unit for evaluating the input means is preferably disposed at least partially on the printed circuit board. Alternatively or additionally the evaluation unit could be positioned at least partially on a layer element, on which the input means is positioned.

It is further proposed that the input unit has at least one rotary switch. A "rotary switch" refers in particular to a switch, which is mounted in such a manner that it can rotate about an axis. The axis is preferably aligned perpendicular to a surface surrounding the rotary switch and/or in particular to a surface of the input unit that can be touched by an operator. The rotary switch allows operation in a manner that is particularly convenient and familiar to the operator.

The invention is also based on a household appliance having a household appliance apparatus, all household appliances that appear expedient to the person skilled in the art being conceivable, such as in particular refrigeration and/or freezer appliances, dishwashers, washing machines, dryers, coffee machines, kneading, whisking and/or mixing appliances and/or in particular kitchen appliances, for example a cooker and/or oven, to be operated with an inventive household appliance apparatus, which allow a household appliance that is particularly easy to operate to be supplied.

Further advantages will emerge from the description of the drawings which follows. The drawing shows exemplary embodiments of the invention. The drawing, description and claims contain numerous features in combination. The person skilled in the art will expediently also consider the features individually and combine them in further useful combinations.

DETAILED DESCRIPTION OF EXEMPLARY EMBODIMENTS OF THE PRESENT INVENTION

Figure 1:
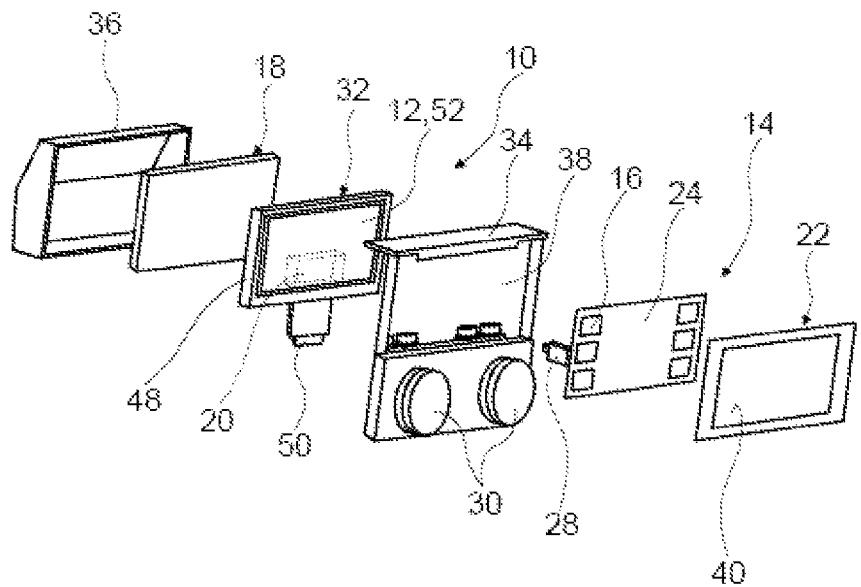
FIG. 1 shows an exploded view of an inventive household appliance apparatus having a display screen and having an input unit.

FIG. 1 shows an inventive household appliance apparatus 10 having an input unit 14, an electronic operating unit 18, a display 32, a front housing element 34 and a rear housing element 36. The display 32 has a display screen 12. During operation the display 32 displays an image on the display screen 12. The rear housing element 36 is made at least partially of a plastic. The front housing element 34 is made at least partially of metal. It has a cutout 38. During manufacture the input unit 14 is latched into the cutout 38. Alternatively an input unit could also be inserted by adhesion or connected to one of the housing elements 34, 36 in another manner that appears expedient to the person skilled in the art. The front housing element 34, the rear housing element 36 and the input unit 14 enclose the display 32 and the electronic operating system 18.

Figure 2:
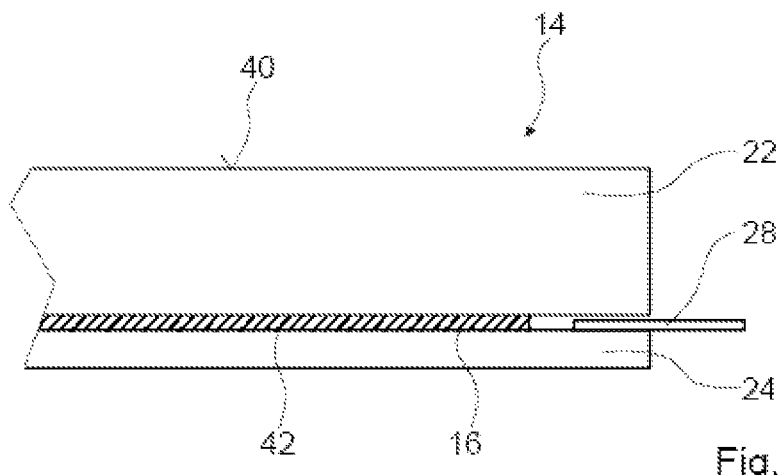
FIG. 2 shows a section through the input unit in FIG. 1.
Figure 3:
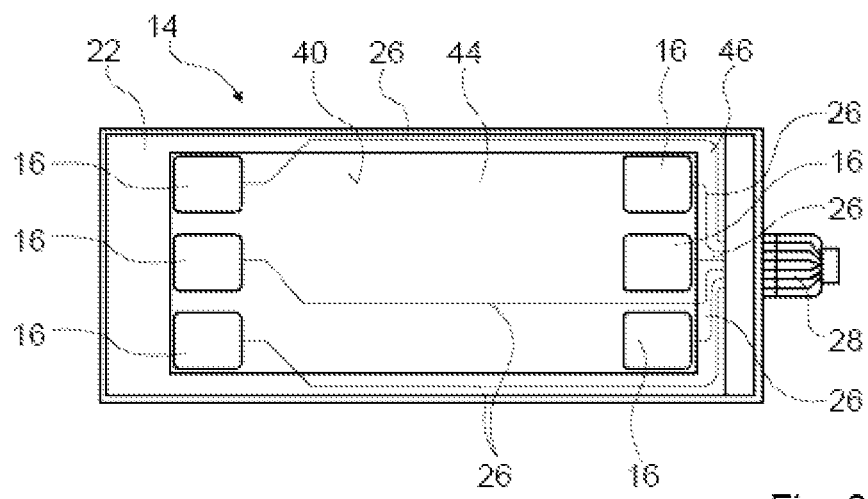
FIG. 3 shows a plan view of the input unit in FIG. 1.

As also shown in FIGS. 2 and 3, the input unit 14 has six input means 16, a front layer element 22 and a rear layer element 24. The front layer element 22 has a surface 40 disposed in such a manner that it can be touched by an operator. The rear layer element 24 is disposed to face the display screen 12. The layer elements 22, 24 are configured as glass plates. The input means 16 are made of indium tin oxide. During manufacture the input means 16 are applied to the rear layer element 24 by sputtering, for example using a cathode sputtering method. Alternatively or additionally an input means could be vapor deposited and/or applied to the front layer element 22. The input means 16 are thus configured as transparent and as a conductive layer. The front layer element 22 is connected to the rear layer element 24 and therefore also to the input means 16 with a material fit, being bonded by means of an adhesive film 42 or an adhesive, using an optical bonding method or another method that appears expedient to the person skilled in the art.

The input unit 14 is disposed partially vertically in front of the display screen 12. The input unit 14 here has a main extension surface, which is larger in all directions than an area of the display screen 12. The input means 16 are disposed along edges of the display screen 12, when viewed from an intended viewing direction of an operator. Half of the input means 16 respectively are disposed on opposing edges of the display screen 12. The input means 16 hereby cover different partial regions of the display screen 12. The input means 16 are disposed at a distance from one another in a direction parallel to the display screen 12, said distance being around 4 mm. The input means 16 each have an area of around 2 cm². The display screen 12 has an area of around 50 cm². Therefore each input means 16 only covers a partial region of the display screen 12, this being around 4%. The input unit 14 covers around 25% of the display screen 12.

The input unit 14 has a flexible printed circuit board 28. The flexible printed circuit board 28 connects the input means 16 to the electronic operating unit 18. To this end the flexible printed circuit board 28 is disposed partially between the two layer elements 22, 24, in a region 46 through which light from the display 32 does not pass, in other words away from a region 44 disposed vertically in front of the display screen 12, through which light passes. The flexible printed circuit board 28 is connected to the rear layer element 24 with a material fit.

The input unit 14 also has transparent conductor paths 26. The conductor paths 26 are applied to the layer element 24 in the same manner as the input means 16. They connect the input means 16 to the flexible printed circuit board 28. To this end conductor paths 26 run partially through the region 44 of the input unit 14, through which light from the display 32 passes. Further conductor paths 26 run through the region 46 of the input unit 14 through which light from the display 32 does not pass. Conductor paths here could be configured as non-transparent.

The electronic operating unit 18 is disposed on a face of the display 32 facing away from the input means 16. The electronic operating unit 18 has a computation unit, which is provided to control the display 32. The electronic operating unit 18 also has an evaluation unit, which determines the characteristic input variables of the input means 16 during operation. The computation unit and the evaluation unit can in some instances be configured as a single piece.

The input means 16 each use the conductor paths 26 to supply one of the characteristic input variables independently of one another during operation. The characteristic input variables are respectively configured as a capacitance of the input means 16. The electronic operating unit 18 is connected by way of a connection (not shown in detail) to the input unit 14, and to the flexible printed circuit board 28. The electronic operating unit 18 makes contact with the input means 16 by way of the conductor paths 26 and the flexible printed circuit board 28.

The electronic operating unit 18 uses a capacitance measuring method that appears expedient to the person skilled in the art to measure the characteristic input variables, in other words a capacitance of the input means 16. When an operator brings an object, a part of the body for example, in proximity to the input means 16, the capacitance of the input means 16 changes. The change is particularly major, when the operator touches the touchable surface 40 in a region adjacent to the input means 16. The electronic operating unit 18 compares a value of the characteristic input variables with a threshold value in each instance. If the value of the characteristic input variables exceeds the threshold value, the electronic operating unit 18 assumes actuation of the associated input means 16. Further evaluation criteria that appear expedient to the person skilled in the art, for example a comparison of a number of values of the characteristic input variables, are conceivable. The electronic operating unit 18 displays different symbols in a partial region of the display screen 12 assigned to the input means 16. The symbols indicate the effect of actuation of the input means 16 to the operator. The electronic operating unit 18 thus combines the input means 16 and the partial region of the display screen 12 to form an adjustable key.

The display 32 is configured as a TFT display. It has a light source (not shown in detail), an image representation means (not shown in detail), a display panel 52 with the display screen 12, a display housing 48 and an electronic display unit 20. The image representation means filters a light from the light source. This produces an image, which the display radiates through the display screen 12. The electronic display unit 20 is configured separately from the electronic operating unit 18. The electronic display unit 20 is connected to the electronic operating unit 18 by means of a connecting element 50. The electronic operating unit 18 transmits image data to the electronic display unit 20 by way of the connecting element 50. The image data is compressed and transmitted in a serial manner in this process.

Figure 4:
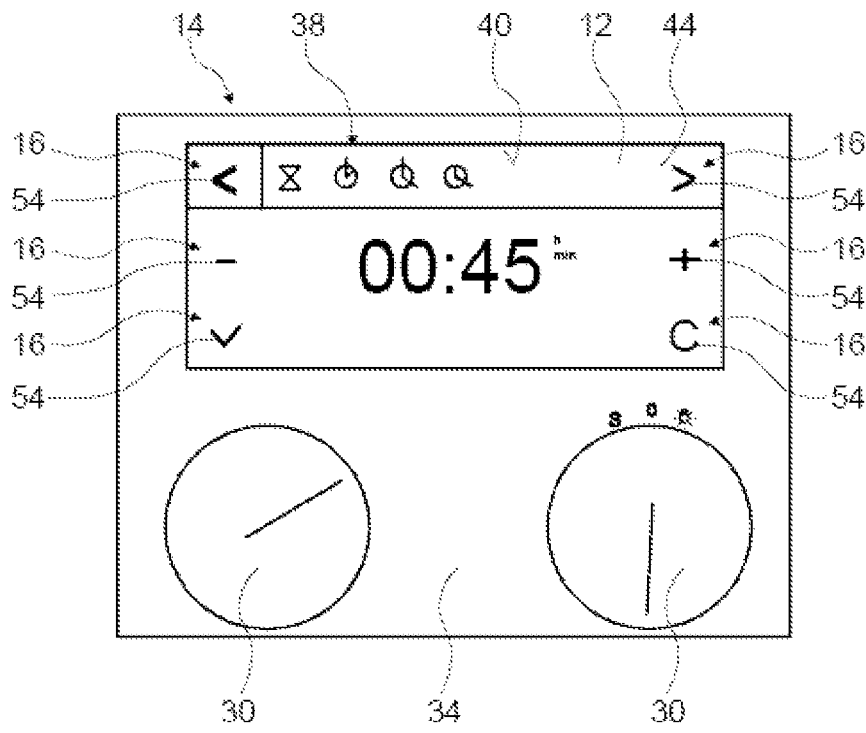
FIG. 4 shows a first plan view of the household appliance apparatus in FIG. 1
Figure 5:
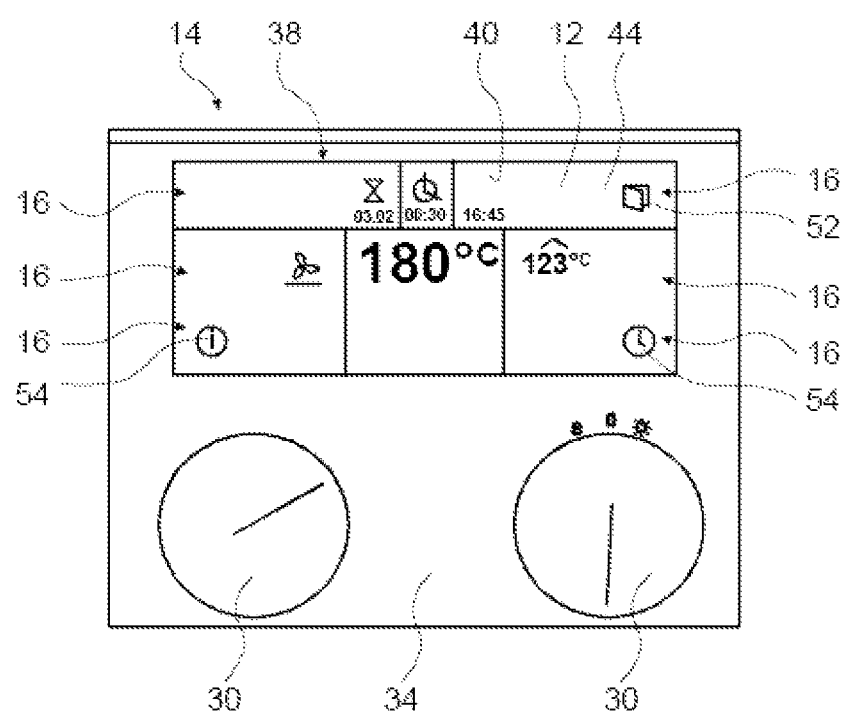
FIG. 5 shows a second plan view of the household appliance apparatus in FIG. 1.

As shown in FIGS. 1, 4 and 5, the input unit 14 has two rotary switches 30. The electronic operating unit 18 evaluates a position of the rotary switches 30. FIGS. 4 and 4 show two different displays on the display screen 12. In the operating state shown in FIG. 4 actuation of all six input means 16 beings about a reaction. In the operating state shown in FIG. 5 only actuation of the three input means 16 stored with symbols 54 brings about a reaction.

REFERENCE CHARACTERS

10 Household appliance apparatus
12 Display screen
14 Input unit
16 Input means
18 Electronic operating unit
20 Electronic display unit
22 Front layer element
24 Rear layer element
26 Conductor path
28 Flexible printed circuit board
30 Rotary switch
32 Display
34 Front housing element
36 Rear housing element
38 Cutout
40 Surface
42 Adhesive film
44 Region through which light passes
46 Region through which light does not pass
48 Display housing
50 Connecting element
52 Display panel
54 Symbol

The invention claimed is:

1. A household appliance apparatus, comprising:
a housing configured to be coupled to one of a household kitchen appliance and a household laundry appliance;
a display screen;
an input unit having at least one substantially transparent input device which only covers a partial region of the display screen; and
an electronic operating unit programmed to control an operation of the one of the household kitchen appliance and the household laundry appliance based on an input to the input unit,
wherein the input unit has at least one rotary switch,
wherein the rotary switch is disposed on the input unit adjacent to the display screen, and
wherein the electronic operating unit is programmed to control the operation of the one of the household kitchen appliance and the household laundry appliance, to change a symbol displayed on the display screen based on a position of the rotary switch, and to change a functionality of the at least one substantially transparent input device corresponding to the symbol based on the position of the rotary switch.

2. The household appliance apparatus of claim 1, wherein the input unit has at least two of said input device, said at least two input devices covering different partial regions of the display screen.

3. The household appliance apparatus of claim 2, wherein the input devices are disposed at a distance from one another.

4. The household appliance apparatus of claim 2, wherein each of the input devices supplies a characteristic input variable to the electronic operating unit, wherein the characteristic input variable of one of the input devices is substantially independently of the characteristic input variable of the other one of the input devices during operation.

5. The household appliance apparatus of claim 1, wherein the electronic operating unit is programmed to combine the input device and the partial region of the display screen to form an adjustable key.

6. The household appliance apparatus of claim 5, further comprising an electronic display unit, which is configured separately from the electronic operating unit.

7. The household appliance apparatus of claim 5, wherein the electronic operating unit is programmed to control an amount of light incident through the at least one substantially transparent input device to change a background image of the at least one substantially transparent input device formed by the light.

8. The household appliance apparatus of claim 5, wherein the at least one substantially transparent input device supplies a characteristic input variable to the electronic operating unit based on the input to the input unit during operation, and
wherein the electronic operating unit is programmed to change an effect of the characteristic input variable, which is supplied to the electronic operating unit by the at least one substantially transparent input device, on the operation of the one of the household kitchen appliance and the household laundry appliance.

9. The household appliance apparatus of claim 1, wherein the input device is configured as a conductive layer.

10. The household appliance apparatus of claim 1, wherein the input unit has at least one layer element, which is connected to the input device with a material fit.

11. The household appliance apparatus of claim 1, wherein the input unit covers at most 50% of the display screen.

12. The household appliance apparatus of claim 1, wherein the input unit has at least one substantially transparent conductor path.

13. The household appliance apparatus of claim 1, wherein the input unit has at least one flexible printed circuit board.

14. A household appliance, comprising:
a housing, wherein the household appliance is one of a household kitchen appliance and a household laundry appliance; and
a household appliance apparatus on the housing of the one of the household kitchen appliance and the household laundry,
said household appliance apparatus, comprising:
a display screen;
an input unit having at least one substantially transparent input device which only covers a partial region of the display screen; and
an electronic operating unit programmed to control an operation of the one of the household kitchen appliance and the household laundry appliance based on an input to the input unit,
wherein the input unit has at least one rotary switch,
wherein the rotary switch is disposed on the input unit adjacent to the display screen, and
wherein the electronic operating unit is programmed to control the operation of the one of the household kitchen appliance and the household laundry appliance, to change a symbol displayed on the display screen based on a position of the rotary switch, and to change a functionality of the at least one substantially transparent input device corresponding to the symbol based on the position of the rotary switch.

15. The household appliance of claim 14, wherein the input unit has at least two of said input device, said at least two input devices covering different partial regions of the display screen.

16. The household appliance of claim 15, wherein the input devices are disposed at a distance from one another.

17. The household appliance of claim 15, wherein each of the input devices supplies a characteristic input variable to the electronic operating unit, wherein the characteristic input variable of one of the input devices is substantially independently of the characteristic input variable of the other one of the input devices during operation.

18. The household appliance of claim 14, wherein the electronic operating unit is programmed to combine the input device and the partial region of the display screen to form an adjustable key.

19. The household appliance of claim 18, wherein the household appliance apparatus includes an electronic display unit, which is configured separately from the electronic operating unit.

20. The household appliance of claim 14, wherein the input device is configured as a conductive layer.

21. The household appliance of claim 14, wherein the input unit has at least one layer element, which is connected to the input device with a material fit.

22. The household appliance of claim 14, wherein the input unit covers at most 50% of the display screen.

23. The household appliance of claim 14, wherein the input unit has at least one substantially transparent conductor path.

24. The household appliance of claim 14, wherein the input unit has at least one flexible printed circuit board.

25. A household appliance apparatus, comprising:
a housing configured to be coupled to one of a household kitchen appliance and a household laundry appliance;
a display screen;
an input unit having at least one substantially transparent input device which only covers a partial region of the display screen; and
an electronic operating unit programmed to control an operation of the one of the household kitchen appliance and the household laundry appliance based on an input to the input unit,
wherein the electronic operating unit is programmed to combine the input device and the partial region of the display screen to form an adjustable key,
wherein the input unit includes at least one rotary switch disposed on the input unit adjacent to the display screen, and
wherein the electronic operating unit is programmed to control the operation of the one of the household kitchen appliance and the household laundry appliance, to change a symbol displayed on the display screen based on a position of the rotary switch, the symbol corresponding to a location of the at least one substantially transparent input device and visible through the at least one substantially transparent input device, and to change a functionality of the at least one substantially transparent input device corresponding to the symbol based on the position of the rotary switch.

26. A household appliance, comprising:
a housing, wherein the household appliance is one of a household kitchen appliance and a household laundry appliance; and
a household appliance apparatus on the housing of the one of the household kitchen appliance and the household laundry,
said household appliance apparatus, comprising:
a display screen;
an input unit having at least one substantially transparent input device which only covers a partial region of the display screen; and
an electronic operating unit programmed to control an operation of the one of the household kitchen appliance and the household laundry appliance based on an input to the input unit,
wherein the electronic operating unit is programmed to combine the input device and the partial region of the display screen to form an adjustable key,
wherein the input unit includes at least one rotary switch disposed on the input unit adjacent to the display screen, and
wherein the electronic operating unit is programmed to control the operation of the one of the household kitchen appliance and the household laundry appliance, to change a symbol displayed on the display screen based on a position of the rotary switch, the symbol corresponding to a location of the at least one substantially transparent input device and visible through the at least one substantially transparent input device, and to change a functionality of the at least one substantially transparent input device corresponding to the symbol based on the position of the rotary switch.

27. A household appliance, the household appliance being one of a household kitchen appliance and a household laundry appliance, the one of the household kitchen appliance and the household laundry appliance comprising:
a housing; and
a household appliance control apparatus on the housing, the household appliance control apparatus, comprising:
a display screen on the housing;
an input unit on the housing, the input unit having at least one substantially transparent input device which covers only a partial region of the display screen; and
an electronic operating unit programmed to control an operation of the one of the household kitchen appliance and the household laundry appliance based on an input to the input unit,
wherein the electronic operating unit is programmed to change a symbol displayed on the display screen based on an input to the input unit, the symbol corresponding to a location of the at least one substantially transparent input device and visible through the at least one substantially transparent input device, and to change a functionality of the at least one substantially transparent input device corresponding to the symbol based on the input to the input unit for controlling the operation of the one of the household kitchen appliance and the household laundry appliance,
wherein the input unit includes at least one rotary switch on the housing, the at least one rotary switch configured to supply the input to the input unit to change the symbol displayed on the display screen and to change the functionality of the at least one substantially transparent input device for controlling the operation of the one of the household kitchen appliance and the household laundry appliance.

* * * * *